United States Patent [19]

Hirabayashi

[11] Patent Number: 4,937,654
[45] Date of Patent: Jun. 26, 1990

[54] ELECTRONIC PART CARRYING STRIP AND METHOD OF MANUFACTURING THE SAME

[75] Inventor: Michio Hirabayashi, Ibaraki, Japan

[73] Assignee: Idec Izumi Corporation, Osaka, Japan

[21] Appl. No.: 137,025

[22] Filed: Dec. 23, 1987

[30] Foreign Application Priority Data

Dec. 26, 1986 [JP] Japan .................................. 61-312487
Dec. 26, 1986 [JP] Japan .................................. 61-312488

[51] Int. Cl.$^5$ .............................................. H01L 23/48
[52] U.S. Cl. ........................................ 357/70; 357/68;
357/72; 357/74; 357/65; 357/80; 437/207;
425/121
[58] Field of Search ................... 437/207; 357/70, 80,
357/68, 72, 74, 65; 425/121; 264/272.17

[56] References Cited

U.S. PATENT DOCUMENTS

3,914,786 10/1975 Grossi ................................... 357/68
4,345,889 8/1982 Sitemore ............................ 425/121

FOREIGN PATENT DOCUMENTS

2176103 10/1973 France .
56-12741 2/1981 Japan ................................. 437/207
2015387 9/1979 United Kingdom .

OTHER PUBLICATIONS

Patent Abstract of Japan, vol. 9, No. 266 (E-352), 1989, 23rd Oct. 1985, JP-A-60 111 481 (Toshida KK) 6/17/85.
Patent Abstract of Japan, vol. 8, No. 36, (E-277, 1473, 16 Feb. 1984, JP-A-58 194 38 (Matsushita Denki Sangyo K.K.) 11/12/83.

Primary Examiner—Andrew J. James
Assistant Examiner—David Soltz
Attorney, Agent, or Firm—Pollock, Vande Sande & Priddy

[57] ABSTRACT

A strip for carrying a plurality of small size electronic parts such as LEDs enclosed hermetically in resin and a method of manufacturing the same. A grid-like conductor strip member is formed by interconnecting lead wires for the electronic parts in a grid-like pattern. The conductor strip member is partially embedded within resin to form a strip segment in which the plurality of electronic parts are mutually connected by runner member. The strip segment has a connecting portion formed integrally at least at one end thereof. By connecting together continuously a number of the strip segments by means of the connecting portions through repetitive cycles of molding operation, the electronic part carrying strip of any desired length up to a semi-endless length can be manufactured.

8 Claims, 7 Drawing Sheets

ELECTRONIC PART CARRYING STRIP AND METHOD OF MANUFACTURING THE SAME

BACKGROUND OF THE INVENTION

1. Field of the Invention

The present invention relates to a molded strip carrying and supporting in an integral structure a plurality of electronic parts of a small size such as LEDs or the like each having an outer peripheral surface hermetically enclosed by molded resin and at least two lead wires extending outwardly. The strip is designated to be used in an automatized production of apparatuses in which the electronic parts are to be employed. The present invention is also concerned with a method of manufacturing the molded strip.

2. Description of the Prior Art

The electronic parts of the type which the present invention concerns are provided in the form of an integrally molded structure in which electrically conductive beam-like members designated to serve as lead wires for each of the electronic parts are embeded within a body of resin. For facilitating the handling of the electronic parts in the course of manufacturing the apparatus in which they are to be employed, it is known to form a grid or lattice-like conductor strip member by mutually connecting the lead wires of the plural electronic parts in a net-like form, wherein the resin bodies each encasing the electronic part are interconnected by means of a runner resin in a single cycle of injection molding.

However, the number of the electronic parts which can be obtained through the single cycle of injection molding is limited due to various factors such as viscosity of plastic material, cooling rate after injection, flow resistance presented by a die used for the injection molding and others.

On the other hand, there exists a constant demand for full automatization of the whole manufacturing process in an effort to reduce the cost involved in manufacturing the electronic parts as well as the relevant apparatuses. Under the circumstance, an electronic part carrying strip of a much increased length up to a semiendless length is desired in which there are incorporated, as interconnected, a greater number of small size electronic parts beyond the limit imposed on the number of parts which can be manufactured through a single cycle of injection molding.

SUMMARY OF THE INVENTION

An object of the present invention is to provide an electronic part carrying strip which can be formed substantially in an indefinite length for the purpose of making available inexpensive electronic parts in the manufacture of electric/electronic apparatuses.

It is another object of the present invention to provide a method of manufacturing the electronic part carrying strip in a convenient manner at low cost.

In view of the above object, it is taught according to an aspect of the present invention that a molded strip segment including in an integral structure a grid-like conductor strip member, molded plastic bodies each enclosing an electronic part mounted on the conductor strip member and runner portions interconnecting the plastic bodies at a predetermined distance therebetween is provided with a connecting portion at one end. The strip segments are integrally interconnected through the connecting portion so that the predetermined distance is maintained between the molded bodies in the interconnected strip. The interconnection of the strip segments are performed upon molding a strip segment within a die assembly by connecting the runner portion of the strip segment being currently molded to that of a preceding molded strip segment by bonding together the connecting portions of these strip segments. By repeating this process, an electronic part carrying strip of any desired length inclusive of essentially endless length can be manufactured.

According to another aspect of the invention, a plastic molding die assembly including a plurality of runners branched from a single injection nozzle is used, wherein quantities of plastic material injected simultaneously through the individual runners are fused together at a mid point between the adjacent runners to thereby form the continuous strip of semi-endless length.

DESCRIPTION OF THE PREFERRED EMBODIMENTS

Now, the invention will be described in detail in conjunction with exemplary and preferred embodiments thereof by reference to the accompanying drawings.

Figure 1:
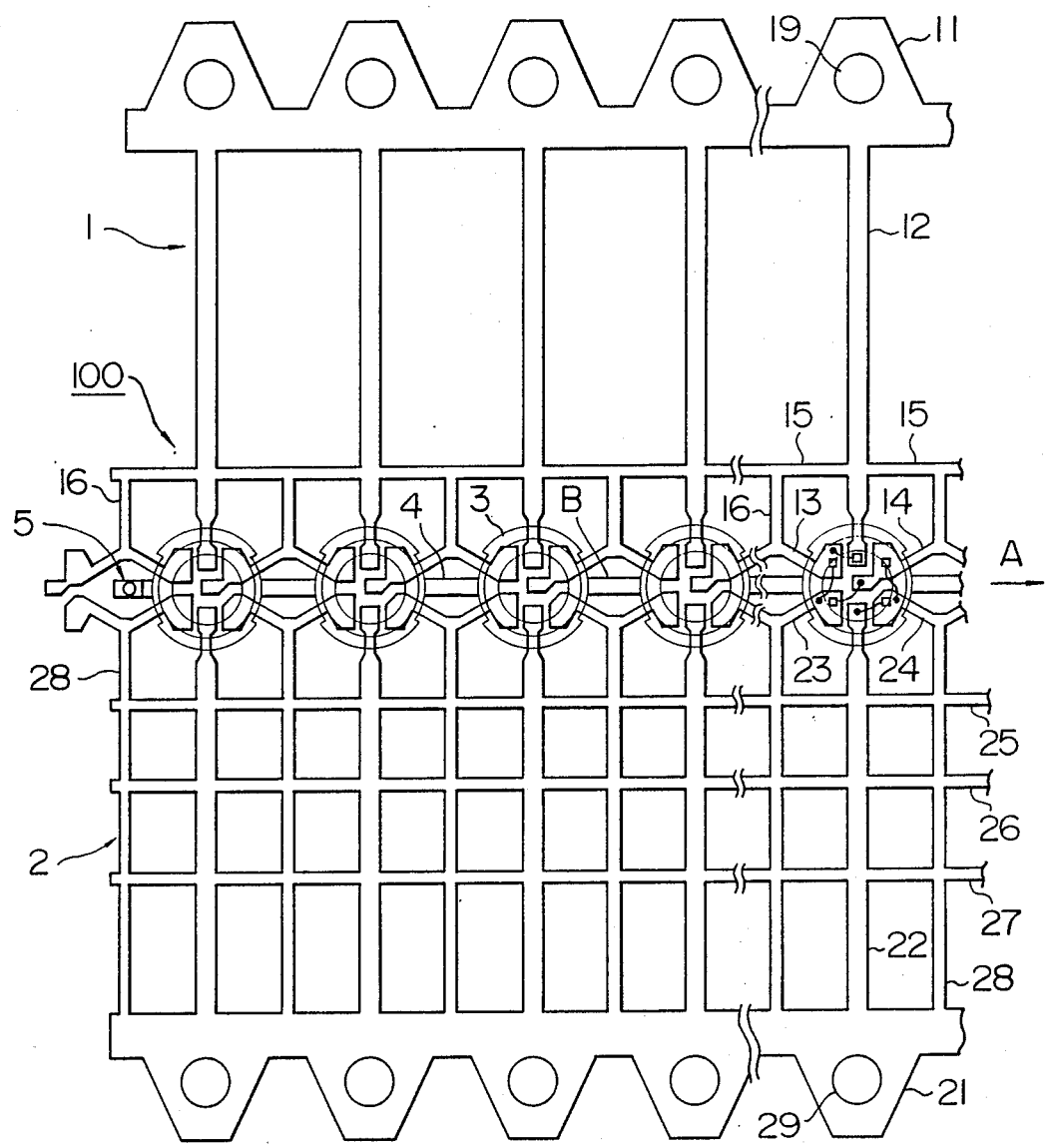
FIG. 1 is a front view showing partially a strip carrying a large number of small size electronic parts integrally incorporated in the strip according to an embodiment of the present invention.

Referring to FIG. 1, a conductor strip member of grid-like or mesh like configuration generally denoted by a reference numeral 100 is composed of a left (upper) strip half 1 and a right (lower) strip half 2 as viewed in the direction A in which the molded product is fed out from the molding die assembly. The left strip half 1 includes a left side guide beam 11, a main lead wire beam 12 extending from the center to the left side guide beam 11, auxiliary lead wire beams 13 and 14 having respective base ends located adjacent to that of the main lead wire beam 12 and extending outwardly with an acute angle relative to the main beam 12, first supporting beams 15 interconnecting the main lead wire beams 12 and second supporting beams 16 for supporting the auxiliary lead wire beams 13 and 14. The left side guide beam 11 is formed with a row of positioning perforations 19 at a predetermined pitch. Similarly, the right strip half 2 includes a right side guide beam 21, main lead wire beams 22, auxiliary lead wire beams 23 and 24 having respective base ends located adjacent to that of the main lead wire beam 22 and extending rightward (downwardly) at an acute angle relative to the latter, three longitudinal supporting beams 25, 26 and 27 for interconnecting the main lead wire beams 22, and transverse supporting beams 28 extending to the right side guide beam 21 in parallel with the main lead wire beam 22 for supporting the auxiliary lead wire beams 23 and 24. The right side guide beam 21 is also formed with a row of positioning perforations 29 at a predetermined pitch. The base ends of the main lead wire beams 12 and 22 are located close in opposition to each other across the center longitudinal axis of the conductor strip member 100.

Each of molded bodies 3 is integrally formed with the associated main lead wire beams 12 and 22, and auxiliary lead wire beams 13, 14, 23 and 24 which have respective base end portions buried integrally in the molded body 3. Additionally, a runner member 4 is integrally formed with the molded bodies 3 and extends along the longitudinal center line of the grid-like conductor strip member 100, whereby a strip segment is formed in which a series of the molded bodies 3 are integrally interconnected.

Figure 2:
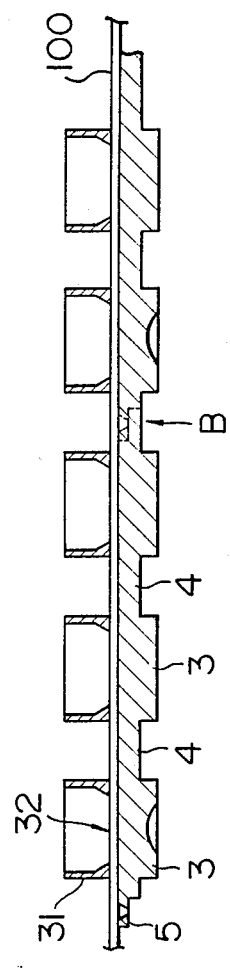
FIG. 2 is a longitudinal sectional view of the strip structure shown in FIG. 1.

Referring to FIGS. 1 and 2, the strip segment located on the right-hand side of a point B as viewed in these FIGS. (for example, as viewed in the direction of transportation) has been formed in precedence to the succeeding strip segment shown on the left-hand side of the point B, wherein both strip segments are integrally connected together at the point B upon injection molding of the succeeding strip segment. To this end, the finally molded strip segment is formed with a connecting portion 5 at the trailing end thereof for allowing the integral connection with a succeeding strip segment as formed. The connecting portion 5 may be of such a structure in which an offset portion of a thickness half that of the runner member 4 is formed in the latter at a center portion thereof, for example, at an intersection between the longitudinal center axis of the runner member 4 and an imaginary line connecting the beams 16 and 28 and a tapered hole is bored in the offset portion by means of a tapered pin 65 moved upwardly in the die assembly, which will be described hereinafter by referring to FIG. 3.

A top half of each molded body 3 is of a cup-like configuration having a peripheral wall 31. The base end portions of the individual lead wire beams are exposed at an opening portion provided in the bottom surface 32 of each molded body 3 and five LEDs, by way of example, are mounted on these base end portions with inner lead wires of the LEDs being electrically bonded thereon. The bottom surface is subsequently sealed hermetically with a transparent resin. After the molded bodies are inspected in the state integrally molded on the strip member 100 in this manner, they are separated into the individual electronic parts.

Figure 3:
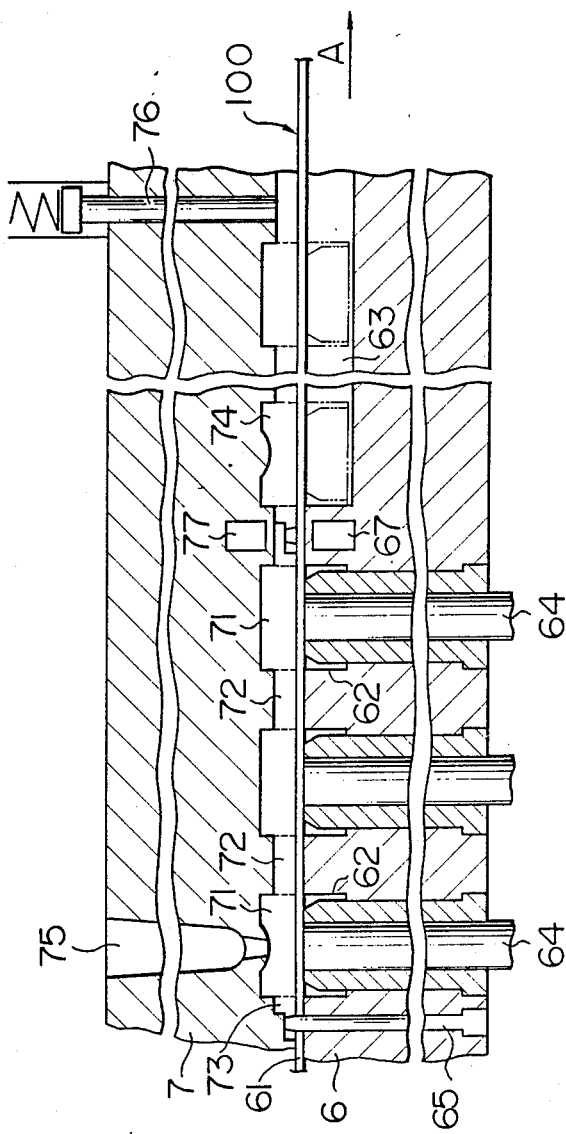
FIG. 3 is a sectional view of a die assembly used for manufacturing the electronic part carrying strip according to an embodiment of the present invention.

FIG. 3 is a view showing a main portion of a die assembly used for manufacturing the electronic part carrying strip according to the invention.

The die assembly comprises as major components thereof a lower die 6 and an upper die 7. There are formed in the top surface of the lower die 6 a recess 61 of a grid-like pattern for receiving therein stationarily the strip member 100 at respective predetermined positions. Die cavities for forming the molded bodies are formed in the upper die 7. More specifically, there are provided first cavities 71 for forming the molded bodies 3 arrayed at a predetermined pitch, second cavities 72 for forming the runner member 4 through which the first cavities 71 communicate with one another, and a third cavity 73 provided at the trailing end of the row of first and second cavities 71 and 72 for forming the aforementioned connecting portion 5, and fourth cavities 74 for holding the molded bodies formed in precedence at predetermined positions. All of the abovementioned cavities are in fluid a communication with a single injection port 75. The lower die 6 is formed with cavities 62 which cooperate with the first cavities 71, respectively, formed in the upper die 7 and a cavity 63 for cooperating with the fourth cavity 74.

As accessory means for the die assembly, there are provided pusher pins 64 disposed immediately below the molded bodies, respectively, for pushing upwardly the latter, the tapered pin 65 for forming the hole in the connecting portion 5 in the manner described hereinbefore, a stopper pin 76 moved downwardly only at the start of the molding operation for interrupting the runner forming cavities 72 at one location thereof, and heaters 67 and 77 for heating the connecting portion of the strip segment molded in precedence.

Figure 4:
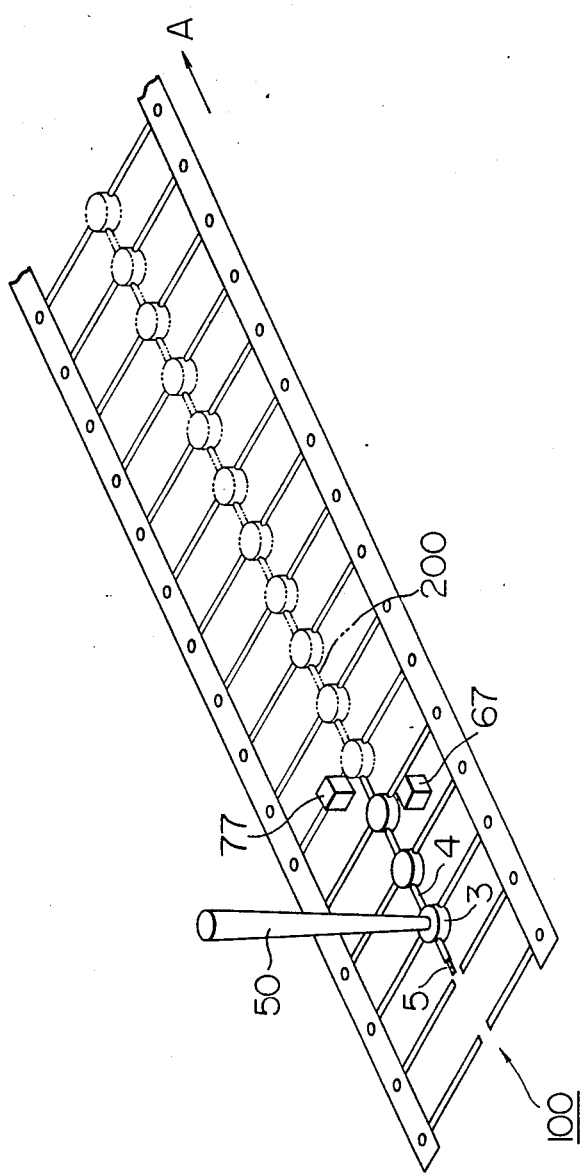
FIG. 4 is a perspective view showing an outer appearance of the electronic part carrying strip in the course of being manufactured by using the die assembly shown in FIG. 3.

Now, description will be directed to a method of manufacturing the electronic part carrying strip according to the invention by referring to FIG. 4 in combination with FIGS. 1 to 3.

Generally speaking, the grid-like conductor strip member 100 formed continuously through a blanking process is placed on the plastic molding die and formed integrally with the molded bodies 3 which are interconnected by the runner member 4. A gate 50 for the runner is provided at a single location of the strip segment to be molded, through which gate the runner communicates with a nozzle of extruder (not shown). The connecting portion 5 integrally formed with the strip segment at the leading end thereof is integrally bonded onto the trailing connecting portion of the preceding strip segment through heat fusion under the action of the heaters 67 and 77 activated at the instant molding step.

The connecting portions 5 are preferably formed with a tapered hole 8 such that when adjacent plastic strip segments are coupled to each other, plastic resin is injected into the tapered holes to integrally interconnect the connecting portions 5.

Figure 5:
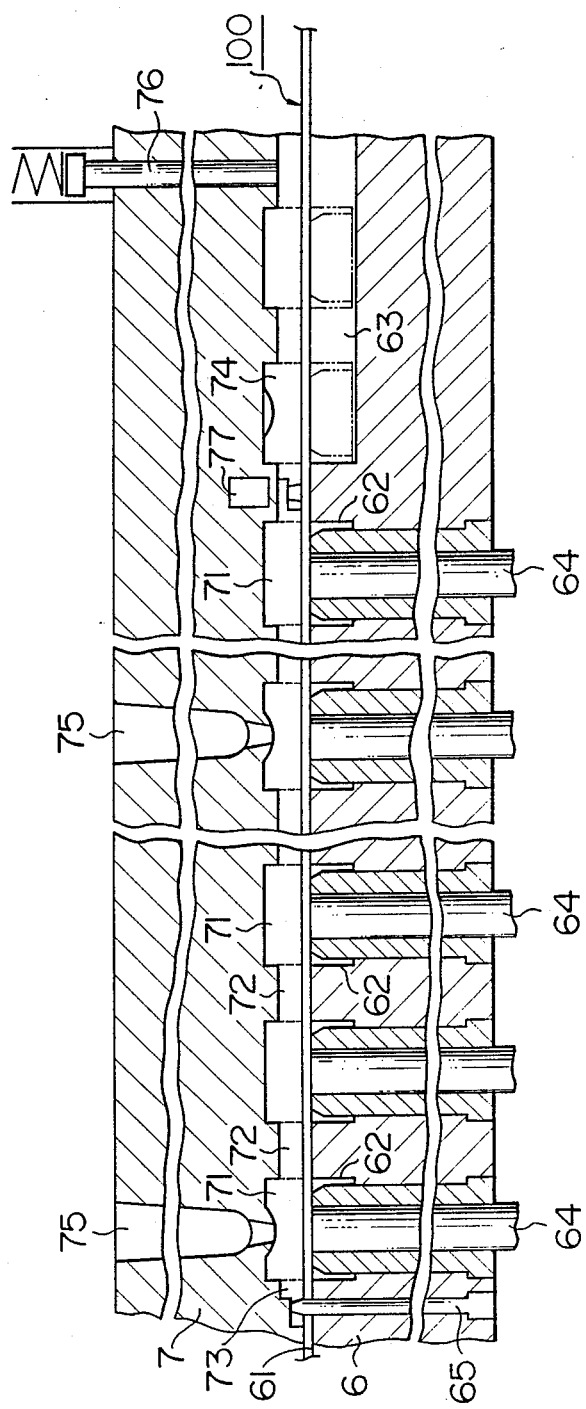
FIG. 5 is a longitudinal sectional view showing a die assembly provided with a plurality of injection gates according to another embodiment of the invention.
Figure 6:
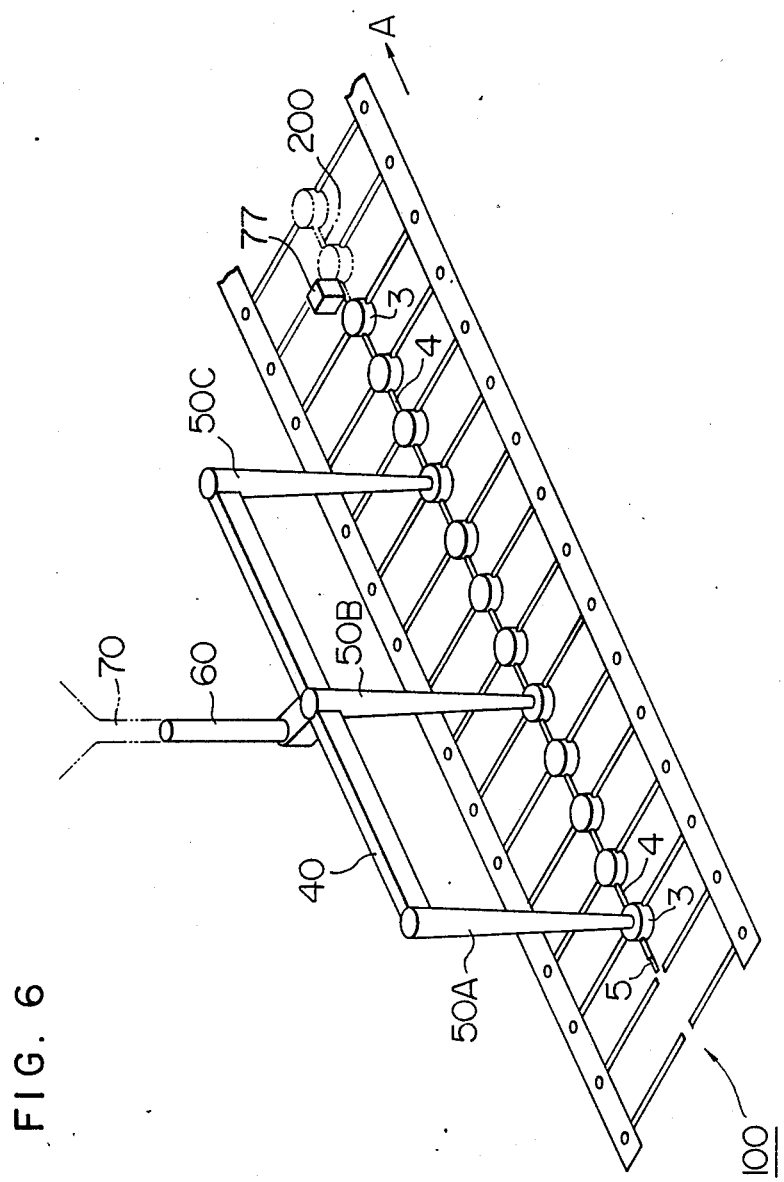
FIG. 6 is a perspective view showing an outer appearance of the electronic part carrying strip in the course of being manufactured by using the die assembly shown in FIG. 5.

FIGS. 5 and 6 show another embodiment of the invention which differs from the preceding one in that a plurality of injection ports 75 (for example, three injection ports) are provided. Further, the heating for bonding together the connecting portions 5 is effectuated only by the upper heater 77. In manufacturing the electronic part carrying strip-like structure by means of the die assembly shown in FIG. 5, a grid-like conductor strip member 100 formed continuously through a blanking process is placed on the lower plastic molding die to be integrally formed with the molded bodies 3 which are interconnected by the runner member 4. Gates 50A, 50B and 50 C for the plastic runner are provided, for example, at three locations, through which the runner communicates with the nozzle 70 of an extruder by way of a sprue 60. The leading connecting portion 5 formed integrally with the strip segment at the leading end thereof is bonded onto the trailing connecting portion of the preceding strip segment 200 through heat fusion under heat generated by the heater 77. According to this manufacturing method, the strip segment as molded at one time can be of an increased length, whereby the number of molding cycles can be correspondingly decreased.

Figure 7:
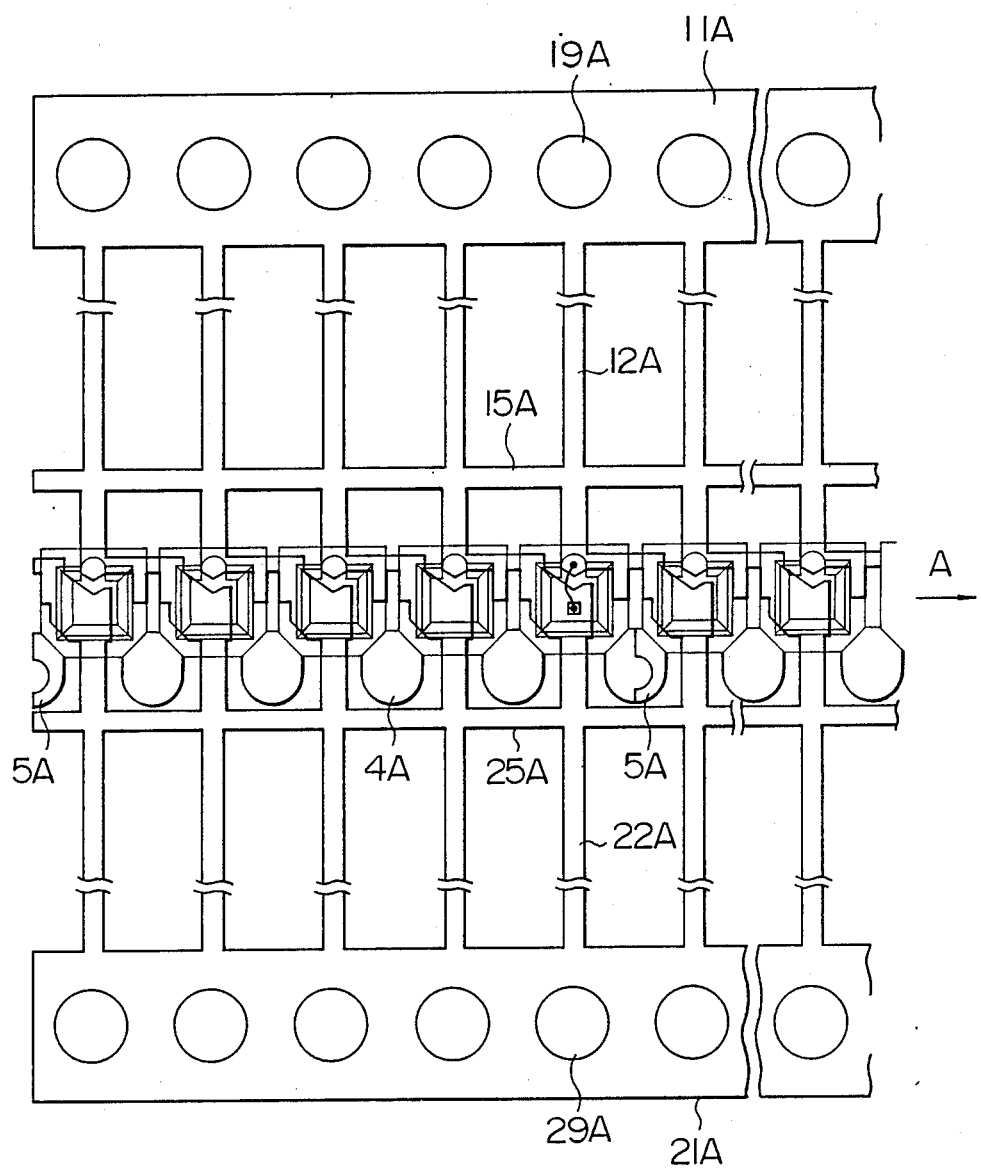
FIG. 7 is a front view showing an electronic part carrying strip according to another embodiment of the invention.

FIG. 7 shows another embodiment of the electronic part carrying strip according to the present invention. This embodiment is of a structure similar to the one shown in FIG. 1 in that the positioning perforations 19A and 29A are formed in left and right guide beams 11A and 21A, respectively, at a predetermined pitch and that the main lead wire beams 12A and 22A extend rightward and leftward from the electronic parts with the auxiliary lead wire beams 15A and 25A interconnecting the main lead wire beams 12A and 22A, respectively. The instant embodiment however differs from the embodiment shown in FIG. 1 in that the beam 12A extends continuously to the left main lead wire 22A which belongs to the same electronic part, that the runner members 4A are provided at a position offset from the longitudinal center line of the strip, and that the connecting portion 5A is realized by a semicircular projection fitted in a semicircular recess.

Figure 8:
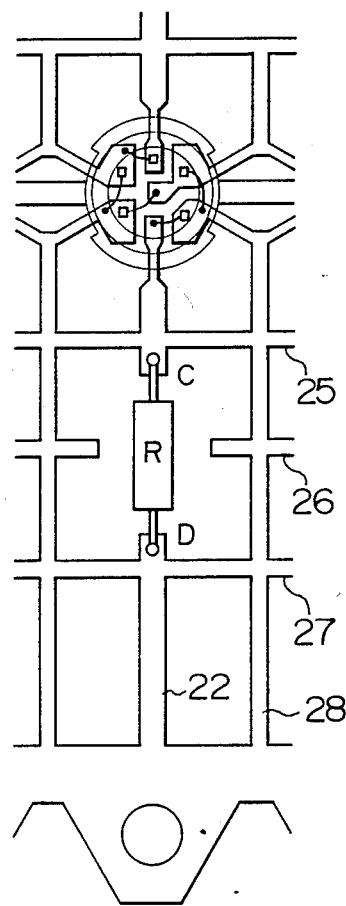
FIG. 8 is a view illustrating an inspection step for the electronic part carrying strip shown in FIG. 1.

Referring to FIG. 8, an electronic part carrying strip manufactured according to the embodiment described hereinbefore in conjunction with FIG. 1 is shown in the state before being inspected. Starting from this state, the main lead wire beam 22 which is destined to serve as the common line for the five LEDs is cut at points C and D and a resistor R (or other circuit element) is connected. In this connection, it is however, to be noted that since the auxiliary lead wire beams 25, 26, 27 and 28 are realized in a grid-like arrangement, the resistor(s) R and or other circuit element(s) may be mounted at desired position as occasion requires. Besides, due to the grid-like structure, rigidness and integrally of the whole strip can be assured even when the lead wire beam(s) is cut for the purpose of mounting the circuit element(s). Upon inspection, the auxiliary lead wire beams 25, 26, 27 and 28 must be previously cut at respective predetermined positions. However, since the electronic parts are interconnected by the runner member 4, they can be subjected to the inspection by an automatized inspection/test apparatus.

Figure 9:
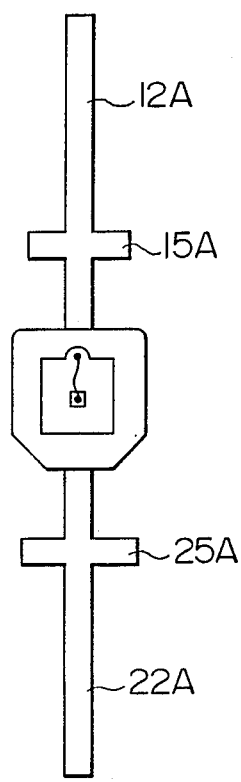
FIG. 9 is a view showing an example of the discrete electronic part in the state cut out from the strip shown in FIG. 7.

FIG. 9 shows, by way of example, in what configuration the electronic part is cut off from the strip manufactured according to the embodiment shown in FIG. 7. As will be seen in FIG. 9, by leaving partially the beams 15A and 25A which interconnect the main lead wire beams 12A and 22A, the remaining portions of the beams 15A and 25A can serve as stoppers or spacers which facilitate the subsequent positioning of the electronic part on an associated printed wiring substrate at a predetermined location.

As will now be appreciated from the foregoing description, according to the present invention that, the strip segment including a runner member interconnecting molded bodies and having connecting portions at the leading and trailing ends respectively is plastically molded and then transported through the die assembly to a succeeding location where a subsequent strip segment is formed integrally with the preceding one with the respective connecting portions being bonded together. This molding cycles can be repeated stepwise substantially endless, whereby the electronic part carrying strip of any desired length can be manufactured to be subsequently fed to an assembling line in the form of the semi-endless strip carrying the electronic parts, which in turn means that the fully automatized assembling process can be realized. Further, since the molded electronic parts can undergo the automatic test/inspection in the automatic test/inspection procedure in the substantially finished state in a continuous manner, the fully automatized inspection can be carried out. Besides, the molded electronic parts are carried by the strip of a substnatially endless length, they can be stored in the wound state in the form of reel, which is very advantageous from the view point of storage and inventory management.

It goes without saying that the strip can be cut in any desired or convenient length for storage or use.

Further, according to a feature of the invention, since a die assembly equipped with several runners branched from a single injection nozzle is employed, a large number of electronic parts can be molded simultaneously through a single molding cycle, which means that the manufacturing efficiency can be enhanced significantly. Besides, by forming the connecting portions integrally with the strip segment at the leading and trailing ends, respectively, the continuous strip of any desired length can be manufactured with high efficiency by repeating the molding cycles in the manner described above.

I claim:

1. An interconnected strip carrying a plurality of small size electronic devices having at least one terminal, said strip comprising:

a grid-like conductor strip member of a belt-like shape as a whole including a plurality of preassigned mount locations provided at a predetermined pitch along a center line of said grid-like conductor strip member and designated for mounting thereon small size electronic devices, and a plurality of conductors extending from each of said preassigned mount locations to both sides of said grid-like conductor strip member, said conductors having respective one end portions positioned closely to one another adjacent to the associated one of said mount locations said end portions being used for connecting said at least one terminal of said electronic device, those of said conductors extending to one side of said grid-like conductor strip member being connected to one another in the longitudinal direction with those conductors extending to the other side of said conductor strip member being connected one to another in the longitudinal direction;

a molded plastic strip segment including molded bodies formed integrally with said grid-like conductor strip member at said preassigned mount locations, respectively, each of said molded bodies having an opening portion at which said end portions of said conductors are exposed and which is used for assembling said electronic device therein, and a runner member formed integrally with said molded bodies so as to interconnect said molded bodies; and connecting portion formed at least at one end of said molded plastic strip segment at such a position that when said molded plastic strip segment is connected to the adjacent plastic strip segment molded in precedence by means of said connecting portion, the distance between said preassigned mount locations for the small size electronic devices positioned on both sides of said connecting portion coincides with said predetermined pitch.

2. An electronic device carrying strip according to claim 1, wherein said connecting portion has such a thickness that when said connecting portion of one plastic strip segment is coupled onto the connecting portion of other adjacent plastic strip segment, the total thickness of the coupled connecting portion become equal to that of said runner member.

3. An electronic device carrying strip according to claim 1, wherein each of said connecting portions is formed with a tapered hole so that when the adjacent plastic strip segments are coupled to each other, plastic resin is injected into said tapered holes to thereby integrally interconnect said connecting portions.

4. An electronic device carrying strip according to claim 1, wherein said connecting portion is formed in the form of an offset-like configuration.

5. An electronic device carrying strip according to claim 4, wherein the offset connecting portion has a thickness half that of said runner member.

6. An electronic device carrying strip according to claim 1, wherein said runner member is provided at a location deviated laterally from the center axis.

7. An electronic device carrying strip according to claim 6, wherein the coupling structure of said connecting portions is realized by fitting of a semi-circular projection in a semi-circular recess.

8. An electronic device carrying strip according to claim 1, wherein the conductor beams extending to said sides from said preassigned location are realized in an integral continuous structure.

* * * * *